(12) United States Patent
Kim et al.

(10) Patent No.: US 11,658,402 B2
(45) Date of Patent: May 23, 2023

(54) ANTENNA DEVICE AND ELECTRONIC DEVICE COMPRISING SAME

(71) Applicant: Samsung Electronics Co., Ltd., Suwon-si (KR)

(72) Inventors: Hyunjin Kim, Seoul (KR); Byungchul Kim, Seongnam-si (KR); Jungmin Park, Seoul (KR); Kwanghyun Baek, Hwaseong-si (KR); Youngju Lee, Seoul (KR); Jungyub Lee, Yongin-si (KR); Sungchul Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 508 days.

(21) Appl. No.: 16/607,953

(22) PCT Filed: Apr. 25, 2018

(86) PCT No.: PCT/KR2018/004811
§ 371 (c)(1),
(2) Date: Oct. 24, 2019

(87) PCT Pub. No.: WO2018/199632
PCT Pub. Date: Nov. 1, 2018

(65) Prior Publication Data
US 2020/0144708 A1    May 7, 2020

(30) Foreign Application Priority Data

Apr. 26, 2017    (KR) .................. 10-2017-0053879

(51) Int. Cl.
*H01Q 1/38* (2006.01)
*H01Q 1/24* (2006.01)
(Continued)

(52) U.S. Cl.
CPC ............ *H01Q 1/38* (2013.01); *H01Q 1/24* (2013.01); *H05K 1/0243* (2013.01);
(Continued)

(58) Field of Classification Search
CPC ............ H01Q 1/38; H01Q 1/24; H01Q 1/243; H01Q 9/0414; H05K 1/0243;
(Continued)

(56) References Cited

U.S. PATENT DOCUMENTS

| 9,209,513 B2 | 12/2015 | Ely et al. | |
| 2004/0145527 A1* | 7/2004 | Mikkola | ............... H01Q 5/335 |
| | | | 343/702 |

(Continued)

FOREIGN PATENT DOCUMENTS

| EP | 1 439 602 A1 | 7/2004 |
| JP | 2015-130699 A | 7/2015 |

(Continued)

OTHER PUBLICATIONS

Korean Office Action dated Mar. 19, 2021, issued in Korean Patent Application No. 10-2017-0053879.

(Continued)

*Primary Examiner* — David E Lotter
(74) *Attorney, Agent, or Firm* — Jefferson IP Law, LLP

(57) ABSTRACT

Disclosed is an electronic device having a space formed between front and rear surfaces thereof, the electronic device comprising: a first cover arranged on the front surface; a second cover arranged on the rear surface; a frame surrounding the first cover and the second cover; and a multilayered circuit board coupled to the second cover so as to constitute the housing of the electronic device, wherein the multilayered circuit board may comprises an insulated metal layer having a surface coupled to the second cover and a substrate-structured antenna device having a surface coupled to the insulated metal layer.

13 Claims, 18 Drawing Sheets

(51) Int. Cl.
  *H05K 1/02*  (2006.01)
  *H05K 5/00*  (2006.01)
  *H05K 7/14*  (2006.01)
  *H05K 9/00*  (2006.01)

(52) U.S. Cl.
  CPC ......... *H05K 1/0277* (2013.01); *H05K 5/0017* (2013.01); *H05K 5/0086* (2013.01); *H05K 7/1427* (2013.01); *H05K 9/0024* (2013.01)

(58) Field of Classification Search
  CPC .. H05K 1/0277; H05K 5/0017; H05K 5/0086; H05K 7/1427; H05K 9/0024; H05K 1/05; H05K 1/11; H05K 1/115
  See application file for complete search history.

(56) References Cited

U.S. PATENT DOCUMENTS

| | | | | |
|---|---|---|---|---|
| 2009/0160713 | A1* | 6/2009 | Nielsen | H01Q 9/0442 |
| | | | | 343/702 |
| 2012/0200464 | A1* | 8/2012 | Nielsen | H01Q 1/243 |
| | | | | 343/702 |
| 2014/0035793 | A1* | 2/2014 | Kato | H01Q 7/06 |
| | | | | 343/867 |
| 2014/0227978 | A1 | 8/2014 | Ikeda et al. | |
| 2014/0228080 | A1 | 8/2014 | Choi et al. | |
| 2015/0214625 | A1 | 7/2015 | Sawa | |
| 2016/0079663 | A1* | 3/2016 | Youm | H01Q 1/243 |
| | | | | 343/702 |
| 2016/0233037 | A1 | 8/2016 | Lee et al. | |
| 2017/0047791 | A1 | 2/2017 | Jang et al. | |
| 2017/0111077 | A1 | 4/2017 | Hwang et al. | |
| 2017/0250466 | A1* | 8/2017 | Schlaffer | H05K 3/4697 |
| 2017/0309991 | A1* | 10/2017 | Noori | H01Q 1/2258 |

FOREIGN PATENT DOCUMENTS

| | | |
|---|---|---|
| JP | 2016-127396 A | 7/2016 |
| KR | 10-2014-0101240 A1 | 8/2014 |
| KR | 10-2015-0091009 A1 | 8/2015 |
| KR | 10-2016-0097105 A | 8/2016 |
| KR | 10-1686784 B1 | 12/2016 |
| KR | 10-2017-0019826 A | 2/2017 |
| KR | 10-2017-0044527 A1 | 4/2017 |

OTHER PUBLICATIONS

Extended European Search Report dated Mar. 11, 2020, issued in European Patent Application No. 18791998.0.

* cited by examiner

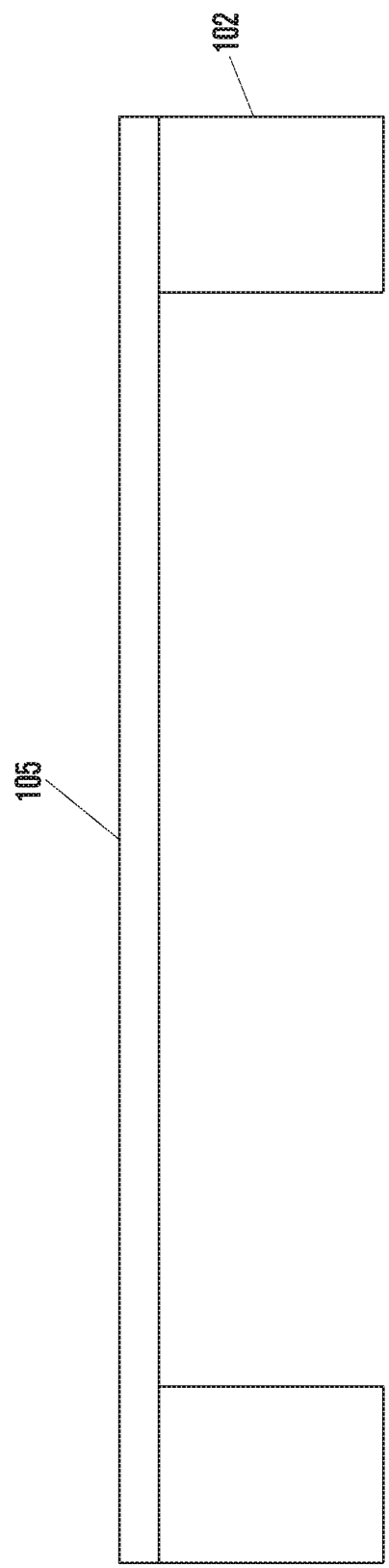

ANTENNA DEVICE AND ELECTRONIC DEVICE COMPRISING SAME

TECHNICAL FIELD

Various embodiments of the disclosure relate to an antenna device constituting a part of a housing of an electronic device and the electronic device including the same.

BACKGROUND ART

In order to satisfy increases in demand for wireless data traffic now that a 4G communication system is commercially available, efforts are being made to develop an enhanced 5G communication system or a pre-5G communication system.

In order to achieve a high data transmission rate, consideration is being given to implementing the 5G communication system in an mmWave band (e.g., 60 GHz band). In order to mitigate any route loss of radio waves in an mmWave band and to increase transmission distances of radio waves, the technologies of beamforming, massive multiple input and output (MIMO), full dimensional MIMO (FD-MIMO), array antenna, analog beamforming, and large scale antenna have been discussed for the 5G communication system.

Further, an external shape of electronic devices is generally made of a dielectric material for transmission and reception of radio waves; but, nowadays, because of demand for an enhanced external appearance, a case or a frame of a metal material is mounted to the electronic device.

DISCLOSURE OF INVENTION

Technical Problem

As an antenna that should be mounted to transmit and receive various frequencies is added, there is a problem that a thickness between a front surface and a rear surface constituting a housing of the electronic device increases.

The disclosure provides an antenna device constituting a part of a housing of an electronic device and the electronic device including the same.

Solution to Problem

According to the disclosure, an electronic device for forming a space between, for example, a front surface and a rear surface includes a first cover disposed on the front surface; a second cover disposed on the rear surface; a frame enclosing the first cover and the second cover; a multilayer circuit board coupled to the second cover to constitute a housing of the electronic device, wherein the multilayer circuit board includes an insulated metal layer having one surface coupled to the second cover; and an antenna device of a substrate structure having one surface coupled to the insulated metal layer.

According to the disclosure, a method of producing a multilayer circuit board constituting a housing of an electronic device may include producing, for example, an anodizable metal substrate or attaching a metal thin plate to a circuit board; anodizing an outermost metal layer; painting an anodized metal and the substrate and molding the anodized metal and the substrate into a desired shape; and mounting the component in the painted and molded substrate.

According to the disclosure, an electronic device includes a housing including, for example, a conductive member; an anodized metal layer at an outer surface of the conductive member; and a multilayer circuit board coupled to the conductive member, wherein the multilayer circuit board includes an anodized layer, a conductive pattern, and a conductive via, and includes an anodized layer included in the multilayer circuit board continuously connected to an outer surface and an anodized layer of the conductive member, and the multilayer circuit board includes an antenna formed with a conductive pattern or a conductive via.

Advantageous Effects of Invention

According to various embodiments of the disclosure, in an antenna device and an electronic device including the same, by enabling the antenna device to form a part of a housing of the electronic device, the electronic device can have a slim structure.

According to various embodiments of the disclosure, in an antenna device and an electronic device including the same, by enabling the antenna device to form a part of a housing of the electronic device, the electronic device can secure various antenna mounting spaces.

BRIEF DESCRIPTION OF DRAWINGS

FIGS. 16A, 16B and 16C are diagrams illustrating a method of producing an electronic device including an antenna device and at least a portion of a frame of the electronic device and a housing as an antenna according to various embodiments of the disclosure.

MODE FOR THE INVENTION

Figure 1:
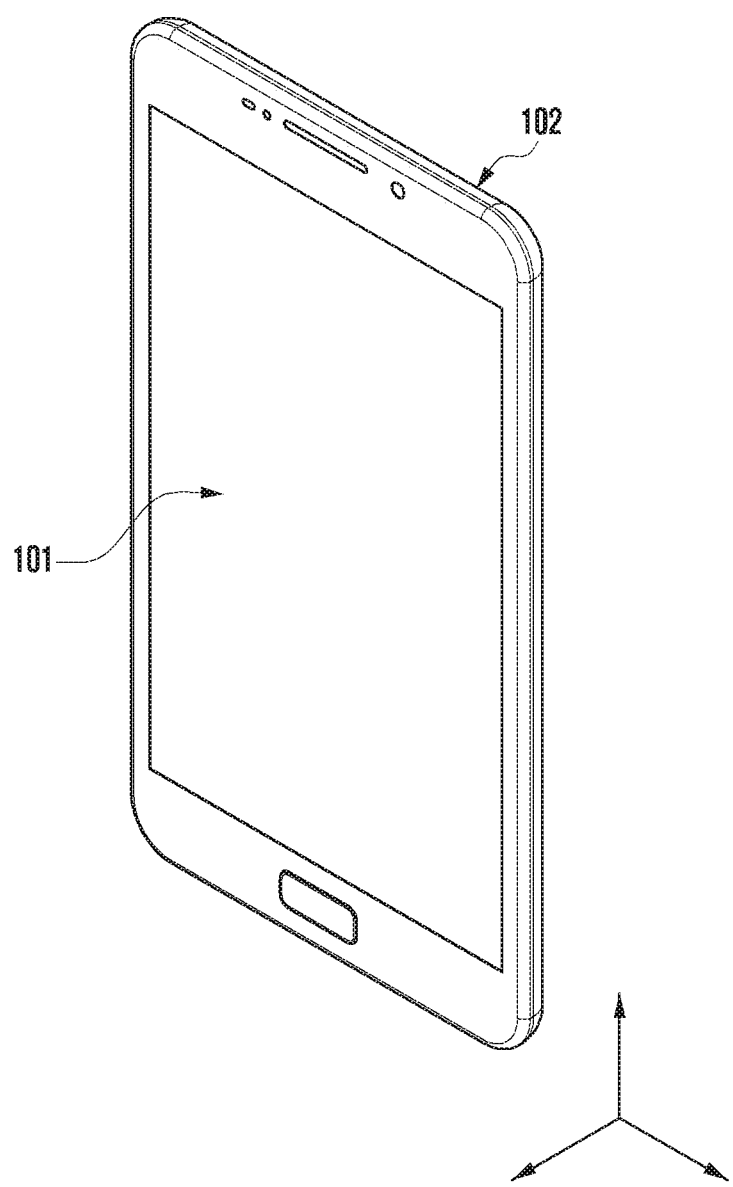
FIG. 1 is a perspective view illustrating an electronic device according to various embodiments of the disclosure.

Hereinafter, various embodiments of this document will be described in detail with reference to the accompanying drawings. It should be understood that embodiments and terms used in the embodiments do not limit technology described in this document to a specific embodiment and include various changes, equivalents, and/or replacements of a corresponding embodiment. The same reference numbers are used throughout the drawings to refer to the same or like parts. Unless the context otherwise clearly indicates, words used in the singular include the plural, and the plural includes the singular. In this document, an expression such as "A or B" and "at least one of A or/and B" may include all possible combinations of the together listed items. An expression such as "first" and "second" used in this document may indicate corresponding constituent elements regardless of order and/or importance, and such an expression is used for distinguishing a constituent element from another constituent element and does not limit corresponding constituent elements. When it is described that a constituent element (e.g., first constituent element) is "(functionally or communicatively) coupled to" or is "connected to" another constituent element (e.g., second constituent element), it should be understood that the constituent element may be directly connected to the other constituent element or may be connected to the other constituent element through another constituent element (e.g., third constituent element).

In this document, "configured to (or set to)" may be interchangeably used in hardware and software with, for example, "appropriate to", "having a capability to", "changed to", "made to", "capable of", or "designed to" according to a situation. In any situation, an expression "device configured to" may mean that the device is "capable of" being configured together with another device or component. For example, a phrase "processor configured to (or set to) perform A, B, and C" may mean an exclusive processor (e.g., embedded processor) for performing a corresponding operation or a generic-purpose processor (e.g., CPU or application processor) that can perform a corresponding operation by executing at least one software program stored at a memory device.

An electronic device according to various embodiments of this document may include at least one of, for example, a smart phone, tablet personal computer (PC), mobile phone, video phone, electronic book reader, desktop PC, laptop PC, netbook computer, workstation, server, personal digital assistant (PDA), portable multimedia player (PMP), MP3 player, medical device, camera, or wearable device. The wearable device may include at least one of an accessory type device (e.g., watch, ring, bracelet, ankle bracelet, necklace, glasses, contact lens), head-mounted-device (HMD), textile or clothing integral type device (e.g., electronic clothing), body attachment type device (e.g., skin pad or tattoo), or bio implantable circuit. In an embodiment, the electronic device may include at least one of, for example, a television, digital video disk (DVD) player, audio device, refrigerator, air-conditioner, cleaner, oven, microwave oven, washing machine, air cleaner, set-top box, home automation control panel, security control panel, media box (e.g., Samsung HomeSync™, AppleTV™, or Google TV™), game console (e.g., Xbox™, PlayStation™), electronic dictionary, electronic key, camcorder, or electronic frame.

In another embodiment, the electronic device may include at least one of various medical devices (e.g., various portable medical measurement devices (blood sugar measurement device, heartbeat measurement device, blood pressure measurement device, or body temperature measurement device, etc.), magnetic resonance angiography (MRA) device, magnetic resonance imaging (MRI) device, computed tomography (CT) device, scanning machine, and ultrasonic wave device), navigation device, global navigation satellite system (GNSS), event data recorder (EDR), flight data recorder (FDR), vehicle infotainment device, ship electronic equipment (e.g., ship navigation device, gyro compass), avionics, security device, vehicle head unit, industrial or home robot, drone, automated teller machine (ATM) of a financial institution, point of sales (POS) of a store, or Internet of things device (e.g., bulb, various sensors, sprinkler, fire alarm, thermostat, street light, toaster, exercise device, hot water tank, heater, boiler). According to an embodiment, the electronic device may include at least one of furniture, a portion of a building/structure or a vehicle, electronic board, electronic signature receiving device, projector, or various measurement devices (e.g., water supply, electricity, gas, or radio wave measurement device). In various embodiments, the electronic device may be flexible or may be two or more combinations of the foregoing various devices. An electronic device according to an embodiment of this document is not limited to the foregoing devices. In this document, a term "user" may indicate a person using an electronic device or a device (e.g., artificial intelligence electronic device) using an electronic device.

Figure 2:
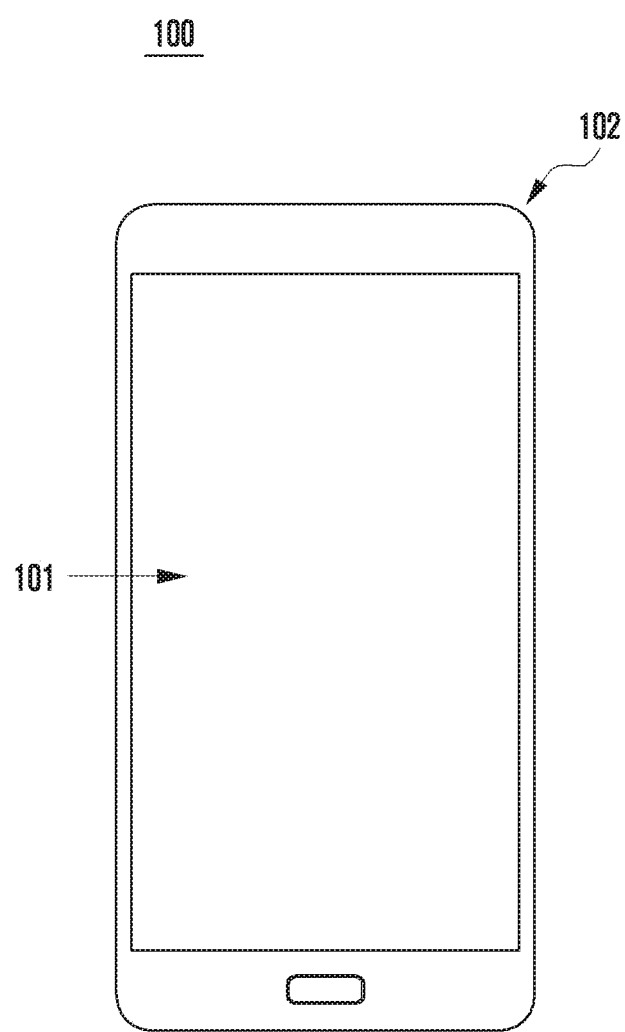
FIG. 2 is a front view illustrating an electronic device according to various embodiments of the disclosure.
Figure 3:
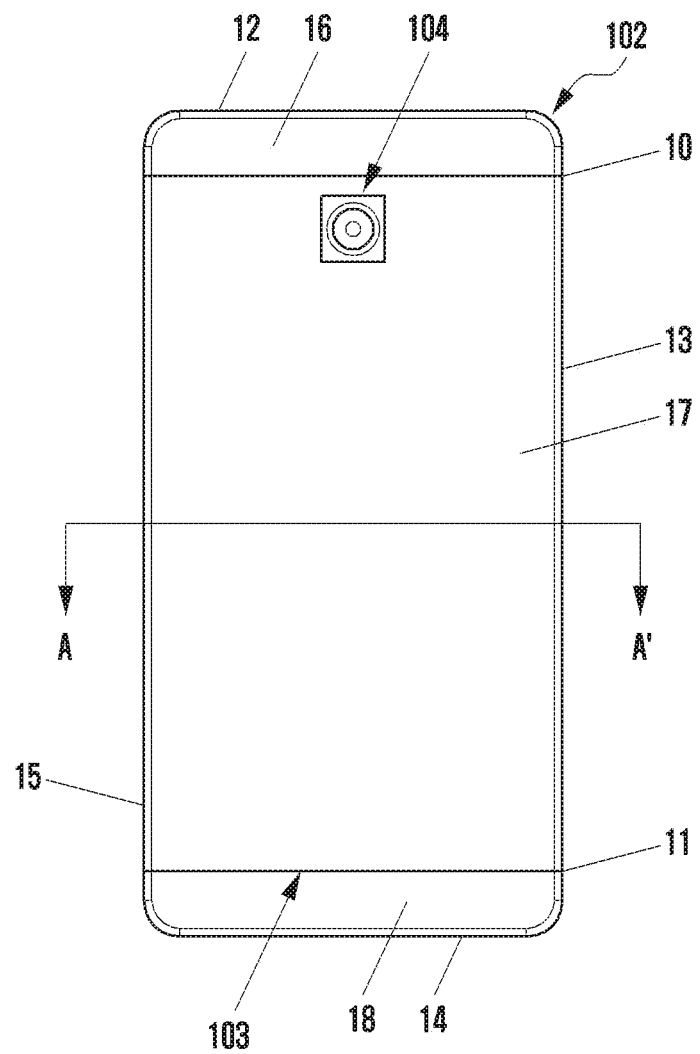
FIG. 3 is a rear view illustrating an electronic device according to various embodiments of the disclosure.

FIG. 1 is a perspective view illustrating an electronic device 100 according to various embodiments of the disclosure. FIG. 2 is a front view illustrating an electronic device 100 according to various embodiments of the disclosure. FIG. 3 is a rear view illustrating an electronic device 100 according to various embodiments of the disclosure. The electronic device will now be described with reference to FIGS. 1 to 3.

In one embodiment, the electronic device 100 may include a first cover 101, frame 102, and second cover 103.

A front surface of the electronic device 100 may include a display. The electronic device 100 may include a first cover 101 to protect a display facing a front surface thereof. The display of the electronic device 100 may be coupled to a touch panel to receive a user input. The first cover 101 may protect the front surface of the electronic device 100. The first cover 101 may be configured with tempered glass or the like so as to transmit light emitted from the display while protecting the front surface of the electronic device 100.

A rear surface of the electronic device 100 may include at least partially a camera 104. In order to protect the rear surface of the electronic device 100, the electronic device 100 may include the second cover 103. The second cover 103 may be formed with tempered glass, plastic, a dielectric material, or a conductive conductor.

The frame 102 may include segments 10 and 11 for forming an antenna. Conductive housings 16, 17, and 18 or conductive frames 12, 13, 14, and 15 separated by the segments 10 and 11 may be used as part of the antenna.

The frame 102 and the conductive housings 16, 17, and 18 may integrally form a housing. An integral housing may include segments 10 and 11 for forming an antenna. The conductive housings 16, 17, and 18 or the conductive frames 12, 13, 14, and 15 separated by the segments 10 and 11 may be used as part of the antenna.

In at least part of an opening formed in the conductive housing 16, 17, and 18 or the frame 102, a multilayer substrate antenna (e.g., an antenna device 220) may be mounted. For example, an antenna using portions of the conductive housings 16, 17, and 18 or portions of the conductive frames 12, 13, 14, and 15 may transmit and receive signals of 5 GHz band or less.

The multilayer substrate antenna (e.g., the antenna device 220) mounted in the conductive housing 16, 17, and 18 or the frame 102 may transmit and receive signals of 20 GHz or more.

According to an embodiment, the multilayer substrate antenna (e.g., the antenna device 220) may be mounted together in the conductive housing antennas 16, 17, and 18 or the conductive frame antennas 12, 13, 14, and 15.

According to an embodiment, the multilayer substrate antenna (e.g., the antenna device 220) may be mounted at a position different from that of the conductive housing antennas 16, 17, and 18 or the conductive frame antennas 12, 13, 14, and 15.

The first cover 101 constituting the front surface of the electronic device 100 and the second cover 103 constituting the rear surface thereof may be formed in a substantially quadrangular or rectangular shape, and the first cover 101 and the second cover 103 may be spaced from each other more than a predetermined distance to form a space for mounting various circuit components and antennas inside the electronic device 100.

The electronic device 100 may include a frame 102 for enclosing a space formed between the first cover 101 and the second cover 103 to form a housing and for protecting the inside thereof. The housing of the electronic device 100 may have a shape in which the frame 102 encloses a space formed between the first cover 101 and the second cover 103.

The frame 102 may have a substantially quadrangular or rectangular edge shape. The frame 102 may be made of tempered glass, a metallic material, plastic, or a dielectric material.

Figure 4:
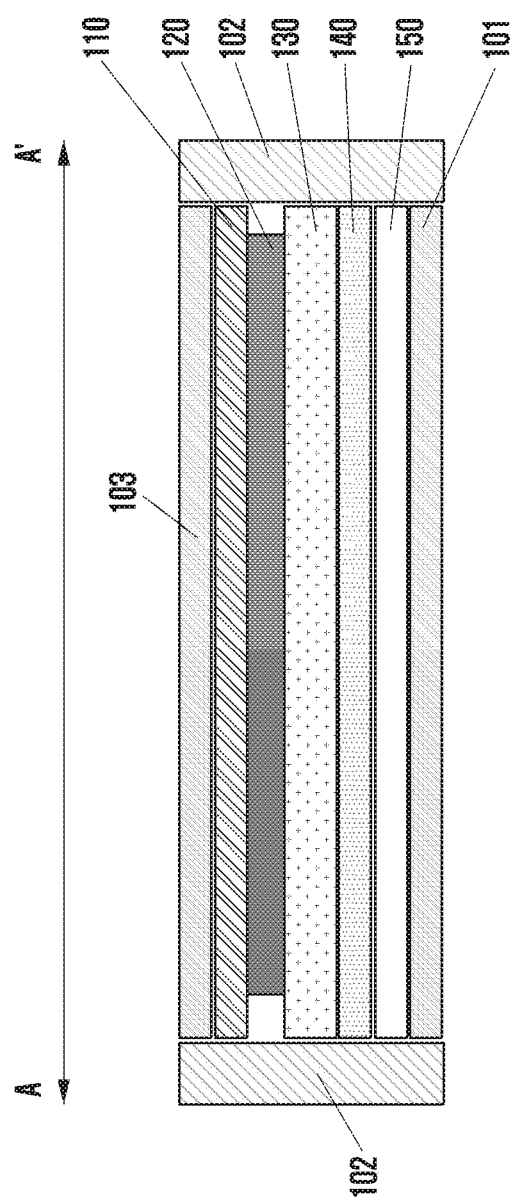
FIG. 4 is a cross-sectional view illustrating an electronic device taken along line A-A' according to various embodiments of the disclosure.

FIG. 4 is a cross-sectional view illustrating an electronic device 100 taken along line A-A' according to various embodiments of the disclosure.

In FIG. 4, the housing of the electronic device 100 may have a structure in which the frame 102 encloses a space formed between the first cover 101 and the second cover 103.

In a space formed by the housing of the electronic device 100, a multilayer circuit board 110, component 120, battery 130, bracket 140, and display 150 may be disposed. In a configuration inside the electronic device 100 with the rear surface up, the multilayer circuit board 110 may be disposed inside the second cover 103, the component 120 may be disposed beneath the multilayer circuit board 110, the battery 130 may be disposed beneath the component 120, the bracket 140 may be disposed beneath the battery 130, the display 150 may be disposed beneath the bracket 140, and the first cover 101 may be disposed beneath the display 150. In a configuration inside the electronic device 100 with the front surface up, in a space formed by the housing, the display 150 may be disposed beneath the first cover 101, the bracket 140 may be disposed beneath the display 150, the battery 130 may be disposed beneath the bracket 140, the component 120 may be disposed beneath the battery 130, the multilayer circuit board 110 may be disposed beneath the component 120, and the second cover 103 may be disposed beneath the multilayer circuit board 110.

The multilayer circuit board 110 may include an antenna device. The component 120 may mount a circuit necessary for driving the electronic device 100. The component 120 may be, for example, an integrated circuit or a ball grid array (BGA) disposed on a substrate. The battery 130 may supply power necessary for driving the electronic device 100. The bracket 140 may alleviate an impact generated in the display 150 while supporting the display 150. The display 150 may be disposed so that a screen faces the first cover 101.

The electronic device 100 may layer the multilayer circuit board 110, the component 120, the battery 130, the bracket 140, and the display 150 in a space formed in the housing.

Figure 5:
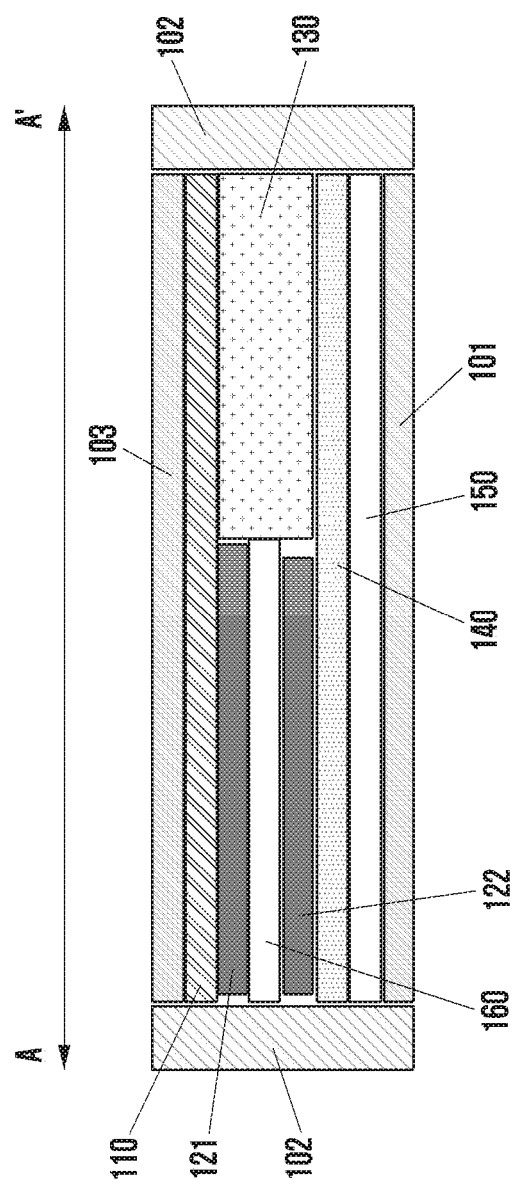
FIG. 5 is a cross-sectional view illustrating an electronic device taken along line A-A' according to various embodiments of the disclosure.

FIG. 5 is a cross-sectional view illustrating an electronic device 100 taken along line A-A' according to various embodiments of the disclosure.

In FIG. 5, the housing of the electronic device 100 may have a structure in which the frame 102 encloses a space formed between the first cover 101 and the second cover 103.

In a space formed by the housing of the electronic device 100, a multilayer circuit board 110, first component 121, second component 122, battery 130, bracket 140, display 150, and main board 160 may be disposed.

In a configuration inside the electronic device 100 with the rear surface up, the display 150 may be disposed beneath the bracket 140 based on the bracket 140, the first cover 101 may be disposed beneath the display 150, the battery 130 may be disposed at one side between the multilayer circuit board 110 and the bracket 140, and constituent elements stacked in order of the first component 121, the main board 160, and the second component 122 may be disposed at the other side therebetween. The battery 130 may be disposed at one side of a separation space between the multilayer circuit board 110 and the bracket 140 and the first component 121, the main board 160, and the second component 122 may be stacked at the other side thereof. In the electronic device 100, a multilayer circuit board 110 may be disposed beneath the second cover 103. The first component 121 and the second component 122 disposed at both surfaces on the main board 160 may be 5G communication related electronic components. The main board 160 may include a 5G communication related radio frequency integrated circuit (RFIC) as the first component 121 and the second component 122.

The frame 102 may include segments 10 and 11 for forming an antenna. Conductive housings 16, 17, and 18 or conductive frames 12, 13, 14, and 15 separated by the segments 10 and 11 may be used as part of the antenna.

The frame 102 and the conductive housings 16, 17, and 18 may integrally form a housing. The integral housing may include segments 10 and 11 for forming the antenna. The conductive housings 16, 17, and 18 or the conductive frames 12, 13, 14, and 15 separated by the segments 10 and 11 may be used as part of the antenna.

The multilayer substrate antenna (e.g., the antenna device 220) may be mounted in at least part of an opening formed in the conductive housing 16, 17, and 18 or the frame 102. For example, an antenna using portions of the conductive housings 16, 17, and 18 or portions of the conductive frames 12, 13, 14, and 15 may transmit and receive signals of 5 GHz band or less.

The multilayer substrate antenna (e.g., the antenna device 220) mounted in the conductive housing 16, 17, and 18 or the frame 102 may transmit and receive signals of 20 GHz or more.

According to an embodiment, the multilayer substrate antenna (e.g., the antenna device 220) may be mounted together in the conductive housing antennas 16, 17, and 18 or the conductive frame antennas 12, 13, 14, and 15.

Figure 6:
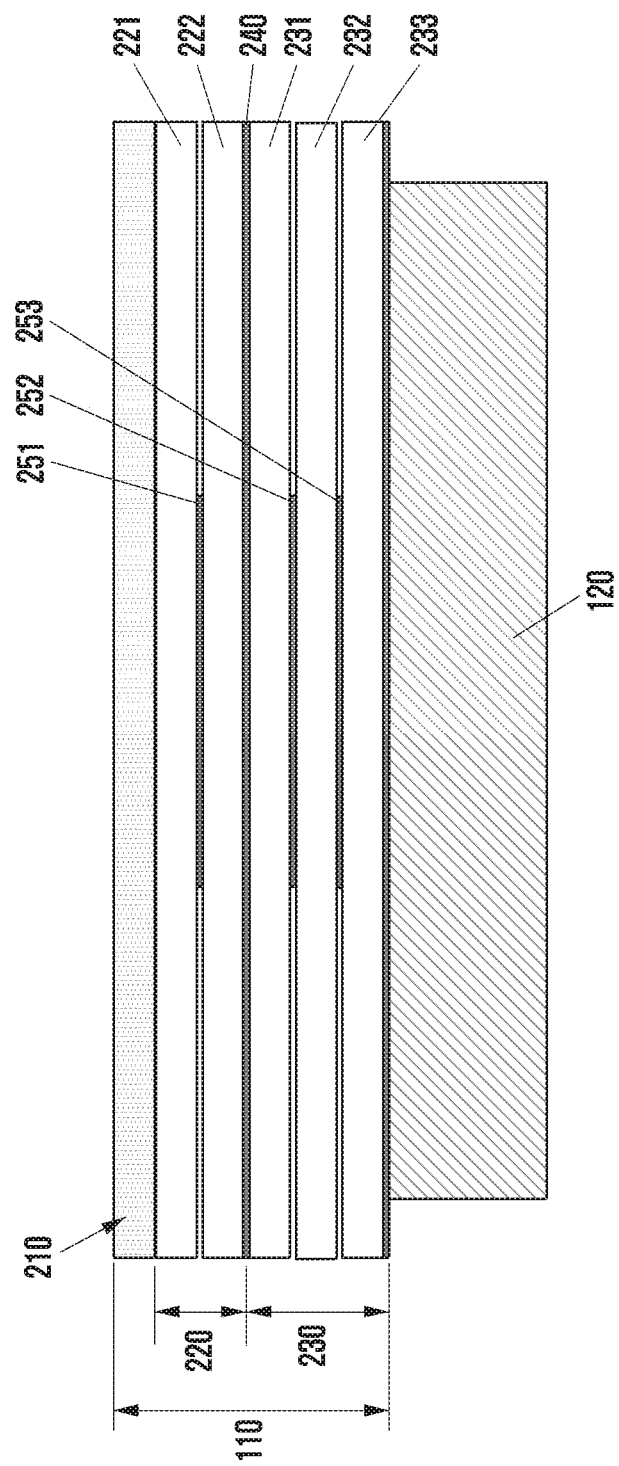
FIG. 6 is a diagram illustrating a multilayer circuit board and a component according to various embodiments of the disclosure.

According to an embodiment, the multilayer substrate antenna (e.g., the antenna device 220) may be mounted at a position different from that of the conductive housing antennas 16, 17, and 18 or the conductive frame antennas 12, 13, 14, and 15. FIG. 6 is a diagram illustrating a multilayer circuit board 110 and components 120 according to various embodiments of the disclosure.

The multilayer circuit board 110 may include an insulated metal layer 210, an antenna device 220, and circuit board layers 230.

The insulated metal layer 210 may form a part of the housing of the electronic device 100. With reference to FIGS. 4 and 5, the multilayer circuit board 110 is disposed beneath the second cover 103, and an insulated metal layer 210 is disposed directly beneath the second cover 103 to support the electronic device 100 together with the second cover 103.

Because the insulated metal layer 210 has insulator characteristics and metal strength, even if the insulated metal layer 210 is configured with the housing of the electronic device 100, the insulated metal layer 210 may protect the inside of the electronic device 100 from an impact. The insulated metal layer 210 may be made of an anodized metal, be made of various metals, and be made of, for example, anodized aluminum. According to various embodiments, the insulated metal layer 210 may be made of a metal coated with an insulator.

In the electronic device 100, the antenna device 220 may be disposed beneath the insulated metal layer 210, the circuit board layer 230 may be disposed beneath the antenna device 220, and the component 120 may be disposed beneath the circuit board layer 230.

The antenna device 220 may include at least one antenna substrate 221 and 222. At least one antenna substrate 221 and 222 may be electrically connected to each of the others using a through electrode 251.

Each of the antenna substrates 221 and 222 may include an antenna pattern for transmitting and receiving radio waves. Antenna patterns disposed at each of the antenna substrates 221 and 222 may be different from each other.

The circuit board layer 230 may include at least one circuit board 231, 232, and 233. Each of the at least one circuit board 231, 232, and 233 may be electrically connected to each of the others using through electrodes 252 and 253. A ground 240 may be disposed between the antenna device 220 and the circuit board layer 230.

The through electrodes 251, 252, and 253 may be formed with a through silicon via (TSV) or various materials and be electrically connected through the vertically stacked circuit boards 231, 232, and 233.

The circuit board layer 230 may include an electronic component (e.g., the component 120) required for driving the electronic device 100. The circuit board layer 230 may include a radio frequency integrated circuit (RFIC) or a processor that controls radio wave transmission and reception in the component 120.

The circuit board layer 230 may be connected to the antenna device 220 by a feeding line to transfer radio waves transferred from the processor or the RFIC to the antenna device 220 or to receive radio waves from the antenna device 220.

The frame 102 may include segments 10 and 11 for forming an antenna. Conductive housings 16, 17, and 18 or conductive frames 12, 13, 14, and 15 separated by the segments 10 and 11 may be used as part of the antenna.

The frame 102 and the conductive housings 16, 17, and 18 may integrally form a housing. The integral housing may include segments 10 and 11 for forming the antenna. The conductive housings 16, 17, and 18 or the conductive frames 12, 13, 14, and 15 separated by the segments 10 and 11 may be used as part of the antenna.

The multilayer substrate antenna (e.g., the antenna device 220) may be mounted in at least part of an opening formed in the conductive housing 16, 17, and 18 or the frame 102. For example, an antenna using portions of the conductive housings 16, 17, and 18 or portions of the conductive frames 12, 13, 14, and 15 may transmit and receive signals of 5 GHz band or less.

The multilayer substrate antenna (e.g., the antenna device 220) mounted in the conductive housing 16, 17, and 18 or the frame 102 may transmit and receive signals of 20 GHz or more.

According to an embodiment, the multilayer substrate antenna (e.g., the antenna device 220) may be mounted together in the conductive housing antennas 16, 17, and 18 or the conductive frame antennas 12, 13, 14, and 15.

Figure 7:
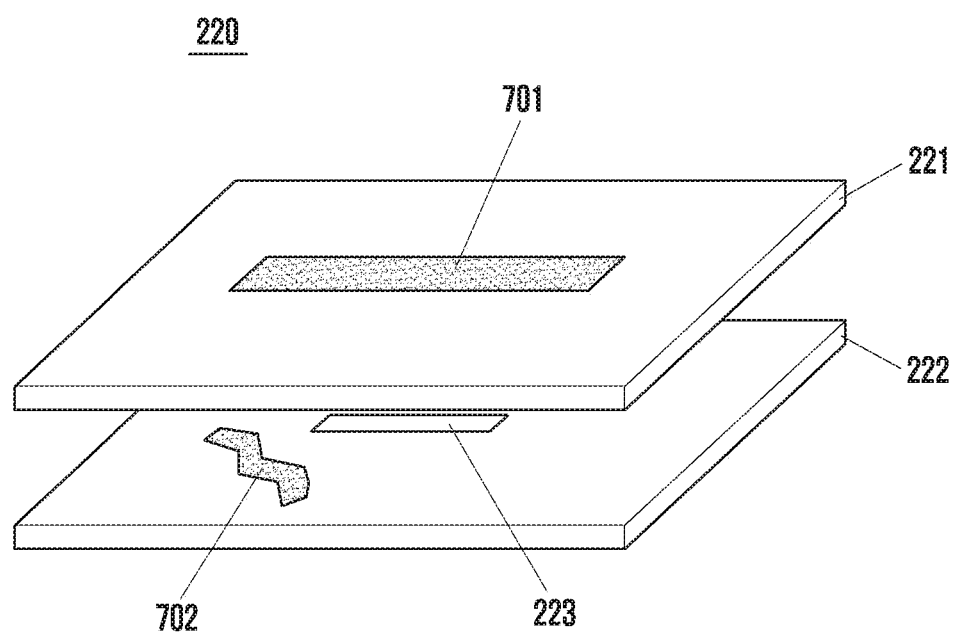
FIG. 7 is a diagram illustrating an antenna device according to various embodiments of the disclosure.

According to an embodiment, the multilayer substrate antenna (e.g., the antenna device 220) may be mounted at a position different from that of the conductive housing antennas 16, 17, and 18 or the conductive frame antennas 12, 13, 14, and 15. FIG. 7 is a diagram illustrating an antenna device 220 according to various embodiments of the disclosure.

The antenna device 220 may include at least one antenna substrate 221 and 222. At least one antenna substrate 221 and 222 may be electrically connected to each of the others using a through electrode 251.

Each of the antenna substrates 221 and 222 may include an antenna pattern for transmitting and receiving radio waves. Antenna patterns disposed at each of the antenna substrates 221 and 222 may be different from each other. For example, an antenna pattern 701 included in the first antenna substrate 221 may be different from an antenna pattern 702 included in the second antenna substrate 222.

Figure 8:
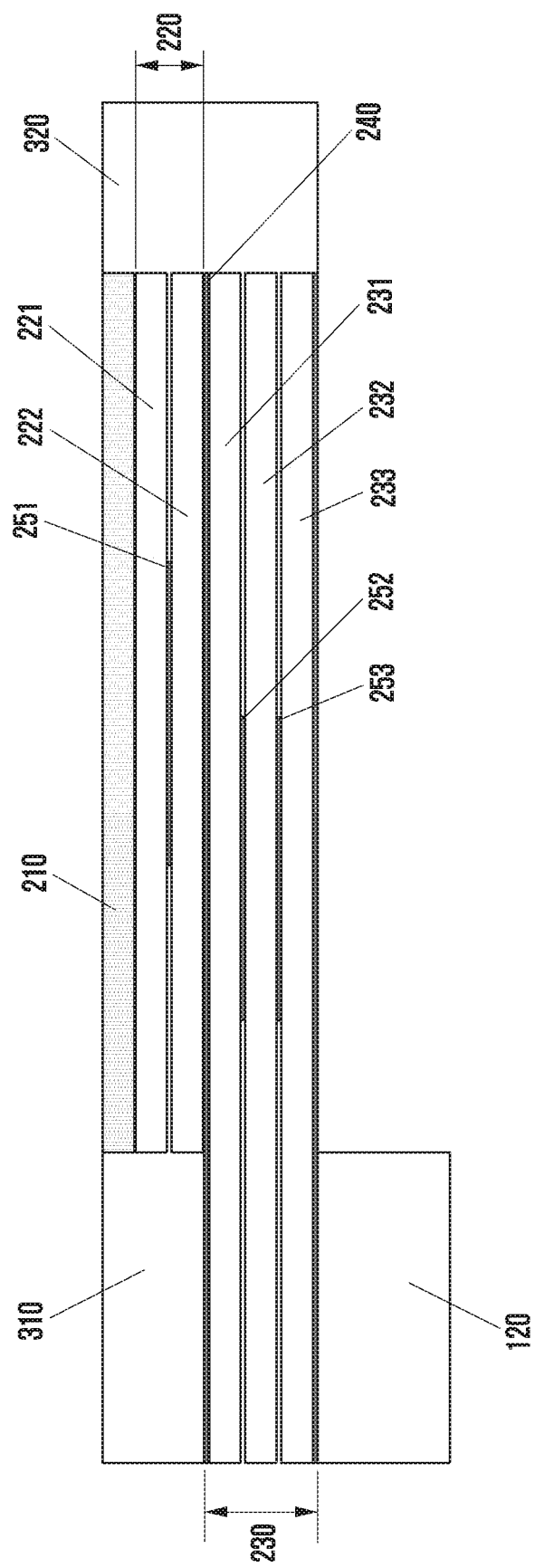
FIG. 8 is diagram illustrating an impact compensation structure of an electronic device according to various embodiments of the disclosure.

FIG. 8 is diagram illustrating an impact compensation structure of an electronic device 100 according to various embodiments of the disclosure.

The antenna device 220 and the circuit board layer 230 may be formed with a printed circuit board (PCB) or the like to form a part of the housing of the electronic device 100 together with the insulated metal layer 210. Because the insulated metal layer 210 is made of a metal to have a high strength material, the insulated metal layer 210 may protect the electronic device 100 from an external impact, but the antenna device 220 and the circuit board layer 230 may be formed with a PCB made of plastic, thereby being weak in an external impact. An impact compensation structure is required to protect the component 120 disposed at the circuit board layer 230. At least one antenna substrate 221 and 222 may be electrically connected to each of the others using the through electrode 251. Each of at least one circuit board 231, 232, and 233 may be electrically connected to each of the others using through electrodes 252 and 253. A ground 240 may be disposed between the antenna device 220 and the circuit board layer 230. Because the insulated metal layer 210 has insulator characteristics and metal strength, even if the insulated metal layer 210 is configured with the housing of the electronic device 100, the insulated metal layer 210 may protect the inside of the electronic device 100 from an impact. The insulated metal layer 210 may be made of an anodized metal, be made of various metals, and be made of, for example, anodized aluminum. According to various embodiments, the insulated metal layer 210 may be made of a metal coated with an insulator.

As illustrated in FIG. 8, when a cross section of the electronic device 100 is viewed in a longitudinal direction, the insulated metal layer 210 and the antenna device 220 may have the same length. The circuit board layer 230 may be longer than the insulated metal layer 210 and the antenna device 220.

When one end of the insulated metal layer 210, the antenna device 220, and the circuit board layer 230 are aligned without a step, a second conductor 320 extended in a longitudinal direction may be disposed at a side surface. Because the circuit board layer 230 is longer than the insulated metal layer 210 and the antenna device 220, a first conductor 310 may be disposed on the insulated metal layer 210, one side surface of the antenna device 220, and the circuit board layer 230. In this case, the circuit board layer 230 may dispose the component 120 in a downward direction of the first conductor 310 to prevent the component 120 from being damaged from an impact. The circuit board layer 230 is disposed longer than the insulated metal layer 210 and the antenna device 220; thus, the component 120 may be disposed in an area other than a point at which the insulated metal layer 210, the antenna device 220, and the circuit board layer 230 are layered. In this case, the first conductor 310 and the component 120 may be disposed at both surfaces of the circuit board layer 230. The first conductor 310 and the second conductor 320 may be made of a metal material.

Figure 9:
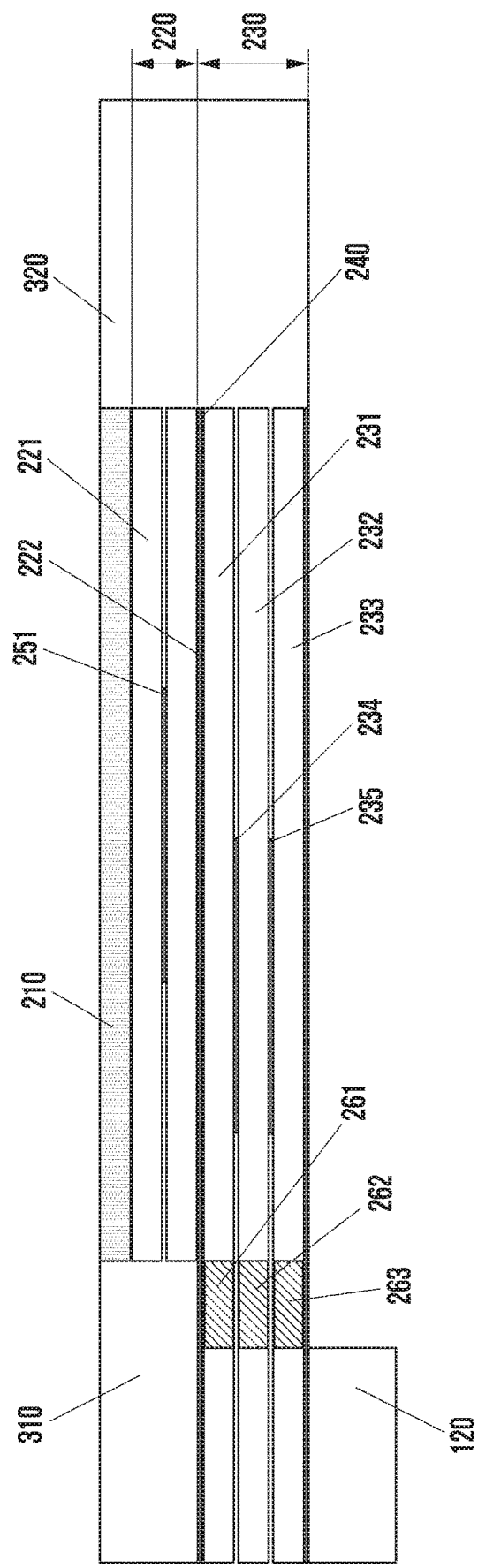
FIG. 9 is diagram illustrating an impact compensation structure of an electronic device according to various embodiments of the disclosure.

FIG. 9 is diagram illustrating an impact compensation structure of an electronic device 100 according to various embodiments of the disclosure.

As illustrated in FIG. 9, when a cross section of the electronic device 100 is viewed in a longitudinal direction, the insulated metal layer 210 and the antenna device 220 may have the same length. The circuit board layer 230 may be longer than the insulated metal layer 210 and the antenna device 220.

When one end of the insulated metal layer 210, the antenna device 220, and the circuit board layer 230 are aligned without a step, a second conductor 320 extended in a longitudinal direction may be disposed at a side surface. Because the circuit board layer 230 is longer than the insulated metal layer 210 and the antenna device 220, the first conductor 310 may be disposed on the insulated metal layer 210, one side surface of the antenna device 220, and the circuit board layer 230. In this case, the circuit board layer 230 may dispose the component 120 in a downward direction of the first conductor 310 to prevent the component 120 from being damaged from an impact. By disposing the circuit board layer 230 to be longer than the insulated metal layer 210 and the antenna device 220, the component 120 may be disposed in an area other than a point at which the insulated metal layer 210, the antenna device 220, and the circuit board layer 230 are layered. In this case, the first conductor 310 and the component 120 may be disposed at both surfaces of the circuit board layer 230. In this case, when connecting the circuit board layer 230 to a substrate in which the component 120 is disposed and a substrate in which the insulated metal layer 210 and the antenna device 220 are stacked with flexible PCBs (FPCBs) 261, 262, and 263, the FPCBs 261, 262, and 263 may absorb an impact; thus, an impact transferred to the insulated metal layer 210 and the antenna device 220 is not transferred to the component 120. The first conductor 310 and the second conductor 320 may be made of a metal material. At least one antenna substrate 221 and 222 may be electrically connected to each of the others using the through electrode 251. Each of the at least one circuit board 231, 232, and 233 may be electrically connected to each of the others using the through electrodes 252 and 253. A ground 240 may be disposed between the antenna device 220 and the circuit board layer 230.

Because the insulated metal layer 210 has insulator characteristics and metal strength, even if the insulated metal layer 210 is configured with the housing of the electronic device 100, the insulated metal layer 210 may protect the inside of the electronic device 100 from an impact. The insulated metal layer 210 may be made of an anodized metal, be made of various metals, and be made of, for example, anodized aluminum. According to various embodiments, the insulated metal layer 210 may be made of a metal coated with an insulator.

Figure 10:
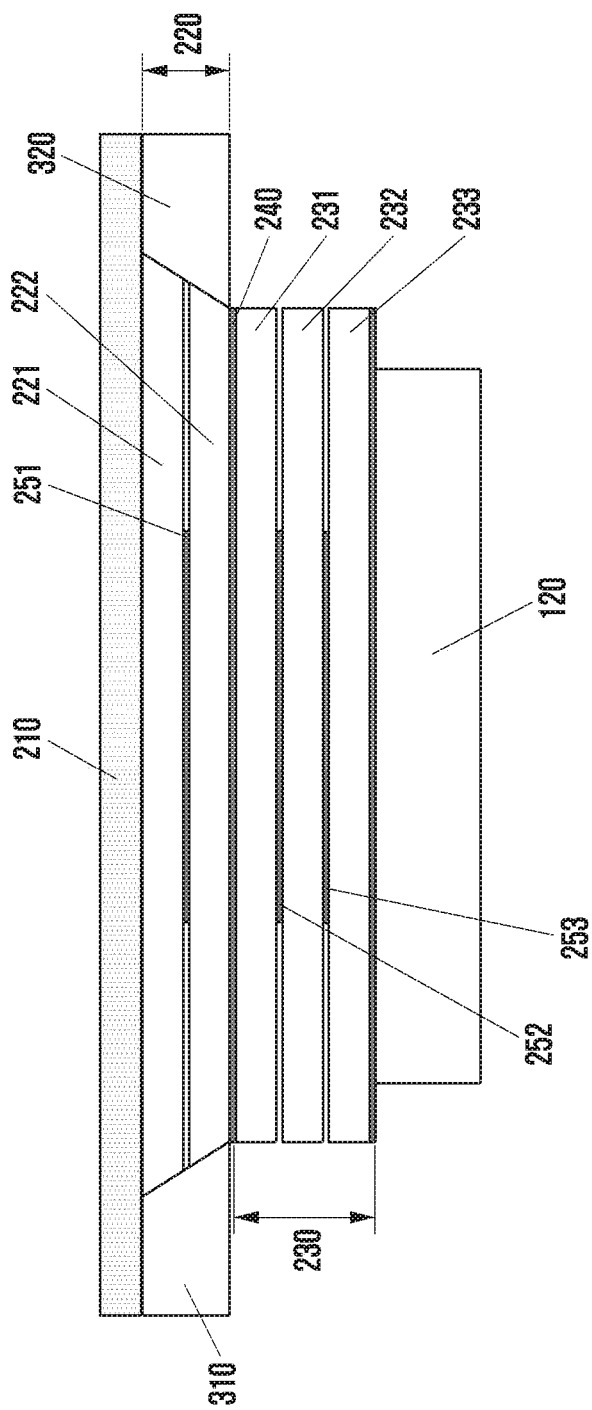
FIG. 10 is diagram illustrating an impact compensation structure of an electronic device according to various embodiments of the disclosure.

FIG. 10 is diagram illustrating an impact compensation structure of an electronic device 100 according to various embodiments of the disclosure.

The antenna device 220 may be a trapezoid having a long rear direction and a short front direction of the electronic device 100. In the antenna device 220, a first conductor 310 may be coupled in an inclined surface direction of one end of the antenna device 220, and a second conductor 320 may be coupled in an inclined surface direction of the other end thereof. The coupled antenna device 220, first conductor 310, and second conductor 320 may form a surface in a rear direction of the electronic device 100, and the insulated metal layer 210 may be disposed at an upper portion of the surface. When the first conductor 310 is coupled in an inclined surface direction of one end of the antenna device 220 and the second conductor 320 is coupled in an inclined surface direction of the other end thereof, even if a force is directed from the outside to the inside, the force is transferred to a slope; thus, the first conductor 310 and the second conductor 320 may disperse an impact to reduce the impact transferred to the component 120. In the electronic device 100, a circuit board layer 230 may be disposed beneath the antenna device 220, and a component 120 may be disposed on the circuit board layer 230. At least one antenna substrate 221 and 222 may be electrically connected to each of the others using the through electrode 251. Each of the at least one circuit board 231, 232, and 233 may be electrically connected to each of the others using the through electrodes 252 and 253. A ground 240 may be disposed between the antenna device 220 and the circuit board layer 230. Because the insulated metal layer 210 has insulator characteristics and metal strength, even if the insulated metal layer 210 is configured with the housing of the electronic device 100, the insulated metal layer 210 may protect the inside of the electronic device 100 from an impact. The insulated metal layer 210 may be made of an anodized metal, be made of various metals, and be made of, for example, anodized aluminum. According to various embodiments, the insulated metal layer 210 may be a metal coated with an insulator.

Figure 11:
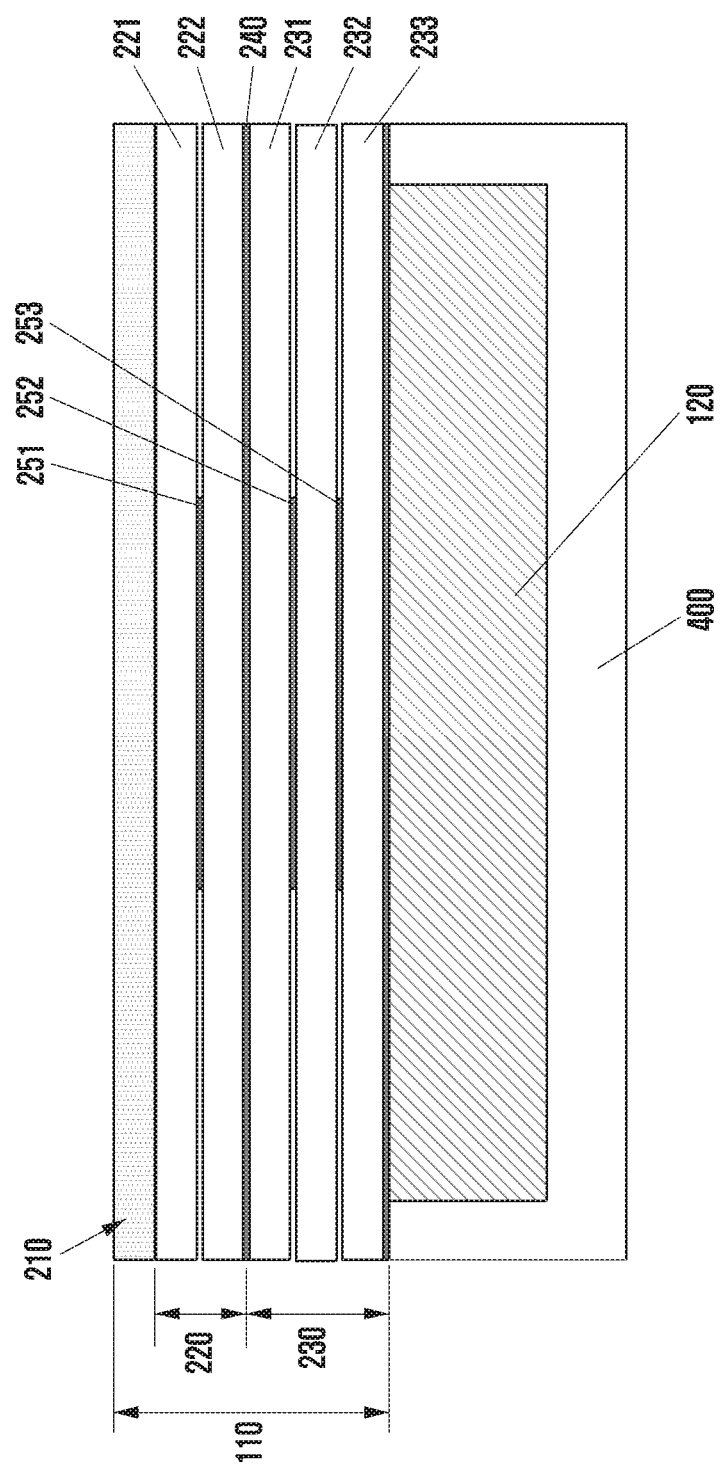
FIG. 11 is diagram illustrating an impact compensation structure of an electronic device according to various embodiments of the disclosure.

FIG. 11 is diagram illustrating an impact compensation structure of an electronic device 100 according to various embodiments of the disclosure.

In the electronic device 100, the antenna device 220 may be disposed beneath the insulated metal layer 210, the circuit board layer 230 may be disposed beneath the antenna device 220, and the component 120 may be disposed beneath the circuit board layer 230. The electronic device 100 may cover the component 120 with a molding 400 in order to protect the component 120. The molding 400 may be coupled to the circuit board 230 to protect the component 120 disposed on the circuit board. The molding 400 may be made of a plastic material or an elastic material.

Figure 12:
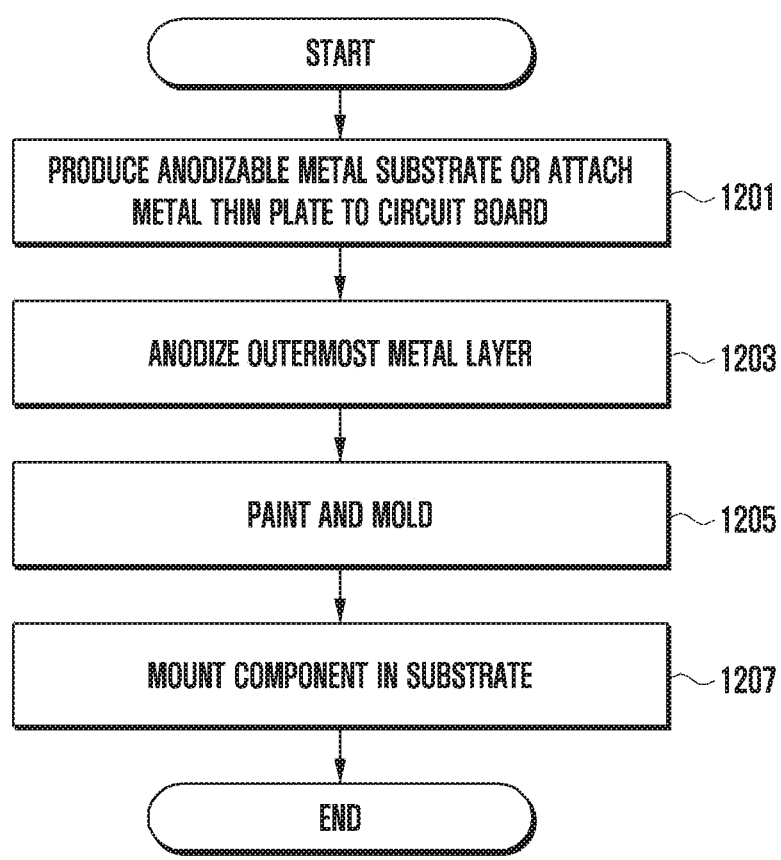
FIG. 12 is a flowchart illustrating a method of producing an electronic device including an antenna device and at least a portion of a frame of the electronic device and a housing as an antenna according to various embodiments of the disclosure.

FIG. 12 is a flowchart illustrating a method of producing an electronic device 100 including an antenna device 220 and at least a portion of a frame 102 of the electronic device 100 and a housing 105 as an antenna according to various embodiments of the disclosure.

In operation 1201, an anodizable metal substrate may be produced or a metal thin plate may be attached to the circuit board.

In operation 1203, an outermost metal layer may be anodized.

In operation 1205, the anodized metal and the substrate may be painted and be molded into a desired shape.

In operation 1207, the component may be mounted in the painted and molded substrate.

Figure 13:
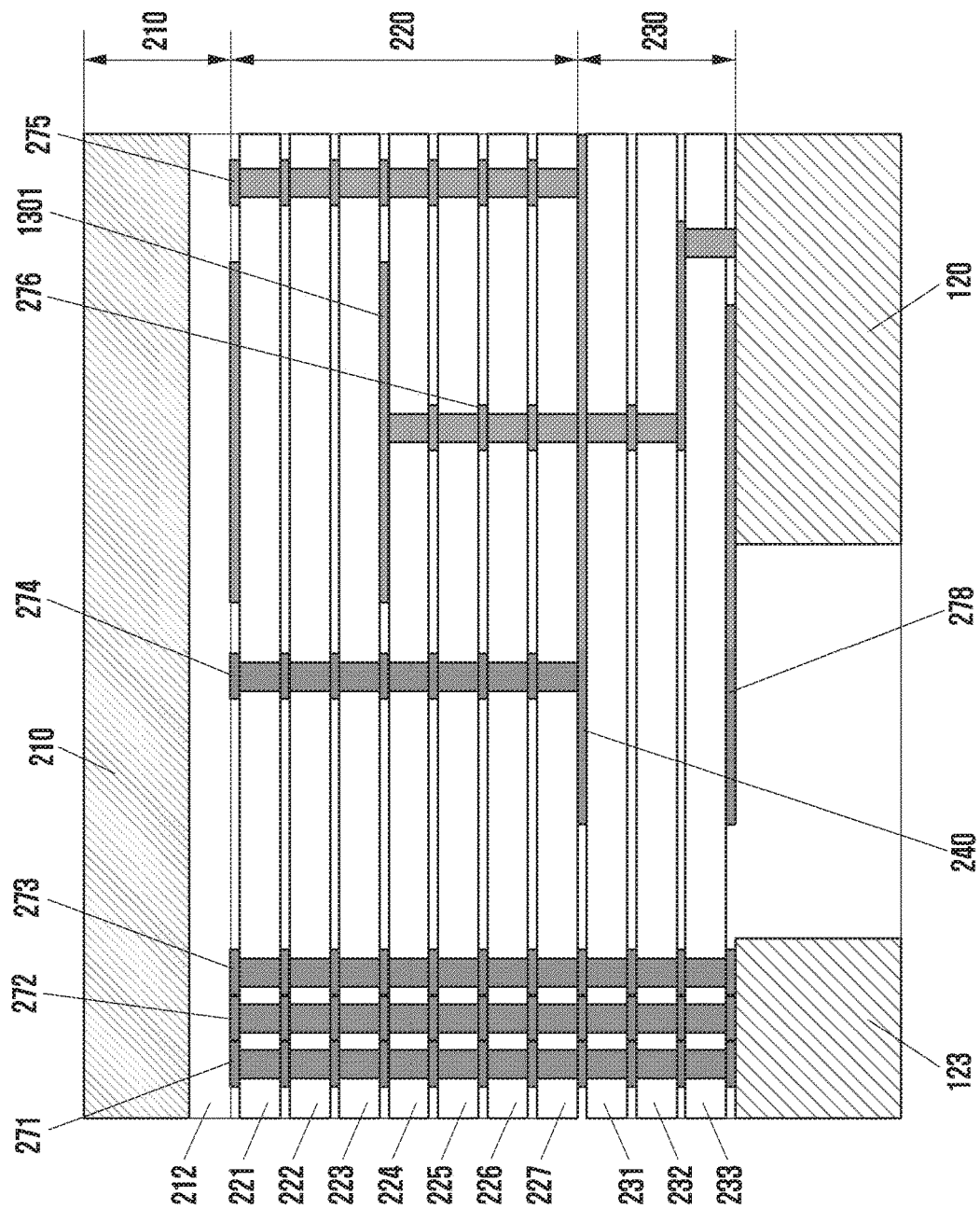
FIG. 13 is diagram illustrating a multilayer circuit board according to various embodiments of the disclosure.

FIG. 13 is diagram illustrating a multilayer circuit board 110 according to various embodiments of the disclosure.

The multilayer circuit board 110 may include a housing layer 211, an antenna device 220, and circuit board layers 230.

The housing layer 211 may include an insulated metal layer 210 and at least one circuit board 212.

The insulated metal layer 210 may form part of the housing of the electronic device 100. Because the insulated metal layer 210 has insulator characteristics and metal strength, even if the insulated metal layer 210 is configured with the housing of the electronic device 100, the insulated metal layer 210 may protect the inside of the electronic device 100 from an impact. The insulated metal layer 210 may be made of an anodized metal, be made of various metals, and be made of, for example, anodized aluminum. According to various embodiments, the insulated metal layer 210 may be made of a metal coated with an insulator.

The circuit board 212 may be connected to the insulated metal layer 210 to transmit and receive signals transferred from the antenna device 220 or the circuit board layer 230 to emit and receive radio waves. In various embodiments, the circuit board 212 may be classified into the antenna device 220 without being classified into the housing layer 211 or may be omitted.

In the electronic device 100, the antenna device 220 may be disposed beneath the insulated metal layer 210, the circuit board layer 230 may be disposed beneath the antenna device 220, and at least one component 120 and 123 may be disposed beneath the circuit board layer 230.

The antenna device 220 may include at least one antenna substrate 221, 222, 223, 224, 225, 226, and 227.

Each of the antenna substrates 221, 222, 223, 224, 225, 226, and 227 may include an antenna pattern for transmitting and receiving radio waves. Antenna patterns disposed at each of the antenna substrates 221, 222, 223, 224, 225, 226, and 227 may be different from each other. According to various embodiments, the antenna pattern may be disposed in a fourth antenna substrate 224 among a first antenna substrate 221, a second antenna substrate 222, a third antenna substrate 223, the fourth antenna substrate 224, a fifth antenna substrate 225, and a sixth antenna substrate 226, and a seventh antenna substrate 227. An antenna pattern 1301 disposed at the fourth antenna substrate 224 may be a pattern for 5G communication.

The circuit board layer 230 may include at least one circuit board 231, 232, and 233. A ground 240 may be disposed between the antenna device 220 and the circuit board layer 230.

Each of the at least one circuit board 231, 232, and 233 may be electrically connected to each of the others using at least one through electrode 271, 272, and 273.

Each of the at least one antenna substrate 221, 222, 223, 224, 225, 226, and 227 may be electrically connected to each of the others using at least one through electrode 271, 272, and 273.

Each of the at least one antenna substrate 221, 222, 223, 224, 225, 226, and 227 and at least one circuit board 231, 232, and 233 may be electrically connected to each of the others using through electrodes 271, 272, and 273.

The antenna device 220 and the circuit board layer 230 may be electrically connected to each other using the through electrodes 271, 272, and 273.

At least one component 120 and 123 may be disposed on the circuit board layer 230. At least one component 120 and 123 may be disposed on the third circuit board 233 among the first circuit board 231, the second circuit board 232, and the third circuit board 233.

The third circuit board 232 may include a component 120 and a legacy band antenna component 123 on the substrate. The legacy band antenna component 123 is a component capable of transmitting and receiving frequencies of an existing band and may transmit and receive frequencies of, for example, a 4G band and a Wi-Fi band.

The legacy band antenna component 123 may be electrically connected to the circuit board 212 on the housing layer 211 through the through electrodes 271, 272, and 273 passing through the antenna device 220 and the circuit board layer 230.

Each of the at least one antenna substrate 221, 222, 223, 224, 225, 226, and 227 may be electrically connected to each of the others using at least one through electrode 274 and 275. Each of the at least one antenna substrate 221, 222, 223, 224, 225, 226, and 227 may be connected to the ground 240 using at least one through electrode 274 and 275.

At least a portion of the antenna device 220 and at least a portion of the circuit board layer 230 may be electrically connected through a through electrode 276.

The fourth antenna substrate 224, the fifth antenna substrate 225, the sixth antenna substrate 226, the seventh antenna substrate 227, the first circuit board 231, and the second circuit board 232 may be electrically connected through the through electrode 276.

The third circuit board 233 may be electrically connected to the component 120 through a through electrode 277.

The through electrode 277 penetrating the third circuit board 233 and the through electrode 276 penetrating the fourth antenna substrate 224, the fifth antenna substrate 225, the sixth antenna substrate 226, the seventh antenna substrate 227, the first circuit board 231, and the second circuit board 232 may be electrically connected through a transmission line 278.

The through electrodes 271, 272, 273, 274, 275, 276, and 277 may be made of a through silicon via (TSV) or various materials and be electrically connected through at least some antenna device 220 and at least some circuit board layer 230 stacked vertically.

Figure 14:
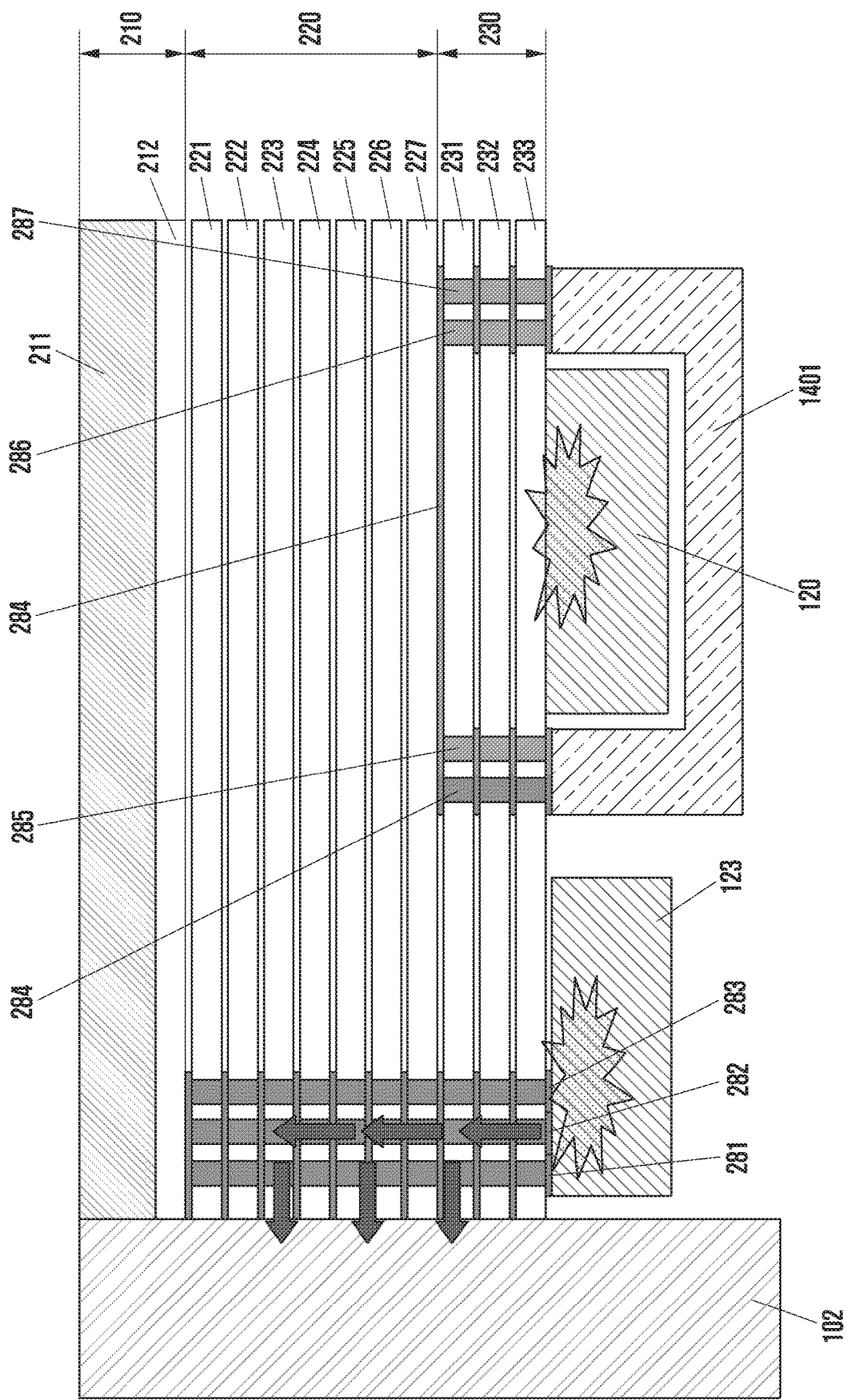
FIG. 14 is diagram illustrating a multilayer circuit board 110 according to various embodiments of the disclosure.

FIG. 14 is diagram illustrating a multilayer circuit board 110 according to various embodiments of the disclosure.

The multilayer circuit board 110 may include a housing layer 211, an antenna device 220, and circuit board layers 230. The frame 102 may be coupled to one side of the multilayer circuit board 110.

The antenna device 220 may include at least one antenna substrate 221, 222, 223, 224, 225, 226, and 227.

The antenna device 220 may include a first antenna substrate 221, second antenna substrate 222, third antenna substrate 223, fourth antenna substrate 224, fifth antenna substrate 225, sixth antenna substrate 226, and seventh antenna substrate 227.

The circuit board layer 230 may include at least one circuit board 231, 232, and 233. A ground 240 may be disposed between the antenna device 220 and the circuit board layer 230.

Each of the at least one circuit board 231, 232, and 233 may be electrically connected to each of the others using at least one through electrode 281, 282, and 283.

Each of the at least one antenna substrate 221, 222, 223, 224, 225, 226, and 227 may be electrically connected to each of the others using at least one through electrode 281, 282, and 283.

Each of the at least one antenna substrate 221, 222, 223, 224, 225, 226, and 227 and at least one circuit board 231, 232, and 233 may be electrically connected to each of the others using through electrodes 281, 282, and 283.

The antenna device 220 and the circuit board layer 230 may be electrically connected to each other using the through electrodes 281, 282, and 283.

At least one component 120 and 123 may be disposed on the circuit board layer 230. At least one component 120 and 123 may be disposed on the third circuit board 233 among the first circuit board 231, the second circuit board 232, and the third circuit board 233.

The third circuit board 232 may include a component 120 and a legacy band antenna component 123 on the substrate. The legacy band antenna component 123 is a component capable of transmitting and receiving frequencies of an existing band and may transmit and receive frequencies of, for example, a 4G band and a Wi-Fi band.

The first antenna substrate 221, second antenna substrate 222, third antenna substrate 223, fourth antenna substrate 224, fifth antenna substrate 225, sixth antenna substrate 226, seventh antenna substrate 227, first circuit board 231, second circuit board 232, and third circuit board 233 include at least one transmission line between each substrate, and the at least one transmission line is connected to at least one through electrode 281, 282, and 283. Heat emitted from the legacy band antenna component 123 may be transferred to the frame 102 through the through electrodes 281, 282, and 283, and heat may be emitted to the outside through the frame 102.

The first circuit board 231, the second circuit board 232, and the third circuit board 233 may be connected to the ground 240 through at least one through electrode 284, 285, 286, and 287; and at least one through electrode 284, 285, 286, and 287 may be connected to a shield can 1401 for covering the component 120. The shield can 1401 for protecting the component 120 may be connected to the ground 240 through at least one through electrode 284, 285, 286, and 287.

Figure 15:
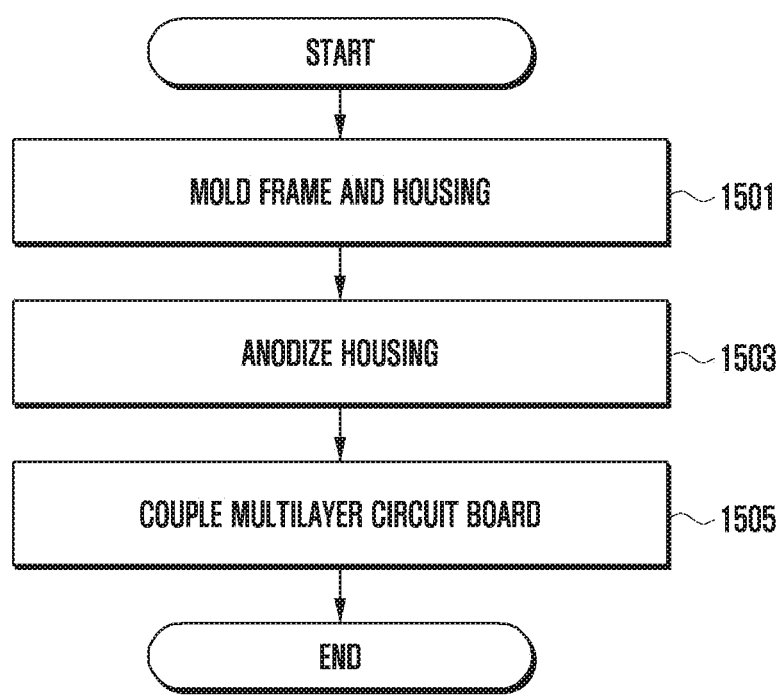
FIG. 15 is a flowchart illustrating a method of producing an electronic device including an antenna device and at least a portion of a frame of the electronic device and a housing as an antenna according to various embodiments of the disclosure.

FIG. 15 is a flowchart illustrating a method of producing an electronic device including an antenna device 220 and at least a portion of a frame 102 of the electronic device and a housing 105 as an antenna according to various embodiments of the disclosure.

In operation 1501, the frame 102 and the housing 105 (e.g., the conductive housings 16, 17, and 18) may be molded into a shape including an opening 1601. The frame 102 and the housing 105 may be made of a metal (e.g., aluminum) material.

In operation 1503, the housing 105 may be anodized.

In operation 1505, the multilayer circuit board 110 including the antenna device 220 may be inserted into the opening 1601 to couple the anodized housing 105 and the multilayer circuit board 110.

Figure 16B:
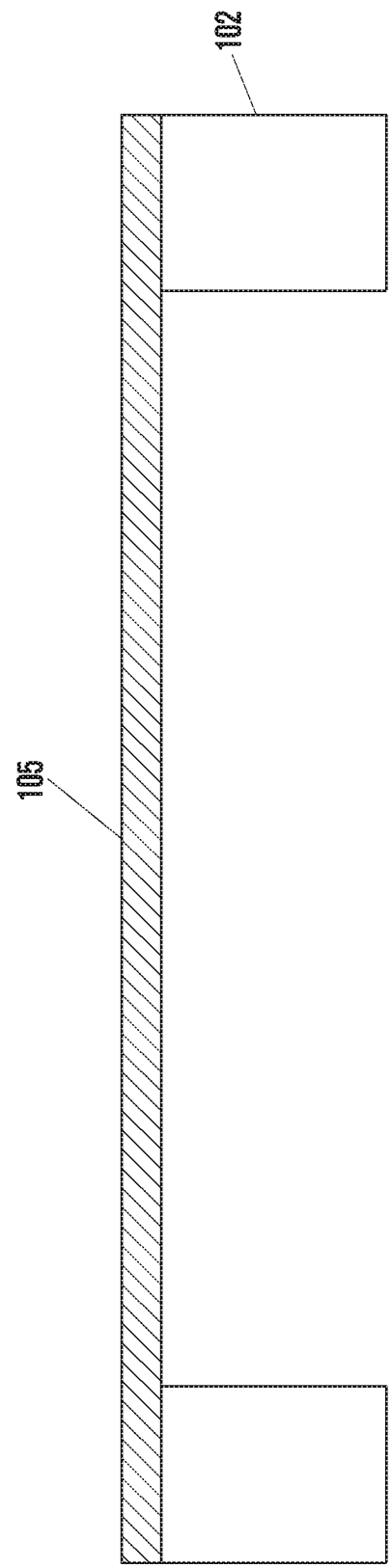

FIGS. 16A and 16B are diagrams illustrating a method of producing an electronic device including the antenna device 220 and at least a portion of the frame 102 and the housing 105 of the electronic device as an antenna according to various embodiments of the disclosure.

FIG. 16A illustrates an operation 1501, and the frame 102 and the housing 105 (e.g., the conductive housings 16, 17, and 18) may be molded into a shape including the opening 1601. The frame 102 and the housing 105 may be made of a metal (e.g., aluminum).

FIG. 16B illustrates an operation 1503, and the housing 105 may be anodized.

Figure 16C:
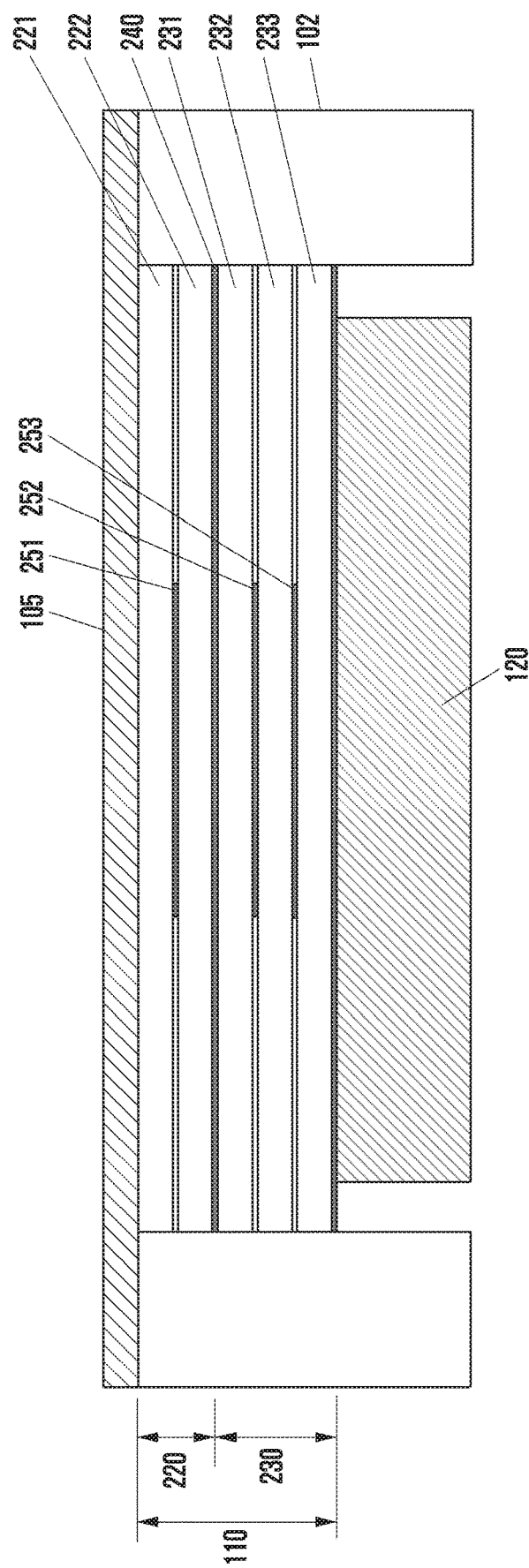

FIG. 16C illustrates an operation 1505, and a multilayer circuit board 110 including an antenna device 220 may be inserted into the opening 1601 to couple the anodized housing 105 and the multilayer circuit board 110.

The multilayer circuit board 110 may include an antenna device 220 and circuit board layers 230.

In the electronic device 100, the circuit board layer 230 may be disposed beneath the antenna device 220 and the component 120 may be disposed beneath the circuit board layer 230.

The antenna device 220 may include at least one antenna substrate 221 and 222. At least one antenna substrate 221 and 222 may be electrically connected to each of the others using a through electrode 251.

Each of the antenna substrates 221 and 222 may include an antenna pattern for transmitting and receiving radio waves. Antenna patterns disposed at each of the antenna substrates 221 and 222 may be different from each other.

The circuit board layer 230 may include at least one circuit board 231, 232, and 233. Each of the at least one circuit board 231, 232, and 233 may be electrically connected to each of the others using the through electrodes 252 and 253. A ground 240 may be disposed between the antenna device 220 and the circuit board layer 230.

The through electrodes 251, 252, and 253 may be formed with a through silicon via (TSV) or various materials and be electrically connected through the vertically stacked circuit boards 231, 232, and 233.

The circuit board layer 230 may include an electronic component (e.g., the component 120) required for driving the electronic device 100. The circuit board layer 230 may include a radio frequency integrated circuit (RFIC) or a processor that controls radio wave transmission and reception in a component 120.

The circuit board layer 230 may be connected to the antenna device 220 by a feeding line, and the circuit board layer 230 may transfer radio waves transferred from the processor or the RFIC to the antenna device 220 or may receive radio waves from the antenna device 220.

A term "module" used in this document includes a unit configured with hardware, software, or firmware and may be interchangeably used with a term such as logic, logic block, component, or circuit. The "module" may be an integrally configured component or a minimum unit that performs at least one function or a portion thereof. The "module" may be implemented mechanically or electronically and may include, for example, an application-specific integrated circuit (ASIC) chip, field-programmable gate arrays (FPGAs), and a programmable logic device, which are known or to be developed in the future, that perform any operation. At least a portion of a device (e.g., modules or functions thereof) or a method (e.g., operations) according to various embodiments may be implemented into an instruction stored at a computer readable storage medium (e.g., memory) in a form of a program module. When the instruction is executed by a processor, the processor may perform a function corresponding to the instruction. A computer readable recording medium may include a hard disk, floppy disk, magnetic medium (e.g., magnetic tape), optical recording medium (e.g., compact disc read-only memory (CD-ROM), digital versatile disc (DVD)), magnetic-optical medium (e.g., floptical disk), and internal memory. The instruction may include a code made by a compiler or a code that may be executed by an interpreter. A module or a programming module according to various embodiments may include at least one of the foregoing elements, may omit some elements, or may further include another element. According to various embodiments, operations performed by a module, a program module, or another constituent element may be sequentially, parallelly, repeatedly, or heuristically executed, at least some operations may be executed in a different order or omitted, or another operation may be added.

The invention claimed is:

1. An electronic device for forming a space between a front surface and a rear surface, the electronic device comprising:
    a first cover disposed on the front surface;
    a second cover disposed on the rear surface;
    a frame enclosing the first cover and the second cover to form a side surface of the electronic device; and
    a multilayer circuit board coupled to the second cover to constitute a housing of the electronic device,
    wherein the multilayer circuit board comprises:
        an insulated metal layer having one surface directly coupled to the second cover,
        an antenna device of a substrate structure having one surface directly coupled to the insulated metal layer, and
        a circuit board layer including a plurality of circuit boards coupled to the antenna device and configured to dispose at least one component at a surface opposite to a coupled surface of the antenna device,
    wherein the insulated metal layer and the antenna device have the same length in a longitudinal direction,
    wherein the circuit board layer has a longer length in a longitudinal direction than that of the antenna device,
    wherein the circuit board layer comprises:
        a first conductor coupled to one side in which the insulated metal layer, the antenna device, and the circuit board layer are aligned without a step in a longitudinal direction, and
        a second conductor coupled on the insulated metal layer, a side surface of the antenna device, and the circuit board layer at the other side having a step,
    wherein the at least one component is disposed at a surface opposite to a surface to which the second conductor is coupled on the circuit board layer, and
    wherein the front surface is on the opposite side of the electronic device from the rear surface.

2. The electronic device of claim 1, wherein the antenna device comprises at least one antenna substrate,
    wherein the antenna substrate comprises an antenna pattern.

3. The electronic device of claim 2,
    wherein the antenna device comprises a plurality of antenna substrates, and
    wherein each antenna substrate is electrically connected through a through electrode and comprises a different antenna pattern.

4. The electronic device of claim 1,
    wherein each of the plurality of circuit boards is electrically connected through a through electrode.

5. The electronic device of claim 1, further comprising a ground at a surface to which the circuit board layer and the antenna device are coupled.

6. The electronic device of claim 1,
    wherein the circuit board layer further comprises a radio frequency integrated circuit (RFIC) capable of transmitting and receiving radio waves, and
    wherein the circuit board layer is connected to the antenna device by a feeding line to transfer a signal transferred from the RFIC to the antenna device or to transfer a radio wave received from the antenna device to the RFIC.

7. The electronic device of claim 1, wherein the circuit board layer connects a region in which the at least one component is disposed and a region in which the at least one component is not disposed by a flex PCB (FPCB).

8. The electronic device of claim 1, further comprising a molding coupled to the circuit board layer to cover the at least one component.

9. The electronic device of claim 1,
    wherein the antenna device has a trapezoidal shape having a long length in a second cover direction and a short length in a first cover direction,
    wherein the antenna device comprises a first conductor and a second conductor coupled to each of inclined surfaces of a trapezoid, and
    wherein the antenna device, the first conductor, and the second conductor form a plane in the second cover direction, and the insulated metal layer is disposed on the plane.

10. The electronic device of claim 1, wherein the insulated metal layer is made of an anodized metal or an insulated metal.

11. The electronic device of claim 1, further comprising:
    a display disposed beneath the first cover from the front surface;
    a bracket configured to support the display and disposed beneath the display from the front surface; and
    a battery disposed between the multilayer circuit board and the bracket.

12. The electronic device of claim 1, further comprising:
    a display disposed beneath the first cover from the front surface;
    a bracket configured to support the display and disposed beneath the display from the front surface; and
    a battery circuit board configured to dispose a battery at one side of a space between the multilayer circuit board and the bracket and to dispose a main board in which a component is mounted at both surfaces at the other side,
    wherein the main board comprises a 5G communication related RFIC, and further comprises a main circuit board disposed between the insulated metal layer and the antenna device.

13. The electronic device of claim 1, further comprising:
    at least one through electrode configured to penetrate both the antenna device and the circuit board layer;
    a transmission line configured to connect the through electrode and the frame;
    a shield can configured to protect the at least one component on the circuit board layer; and at least one through electrode configured to penetrate the circuit board layer to electrically connect the shield can and a ground.

\* \* \* \* \*